(12) United States Patent
Kim et al.

(10) Patent No.: US 11,409,198 B2
(45) Date of Patent: Aug. 9, 2022

(54) HARDMASK COMPOSITION, HARDMASK LAYER AND METHOD OF FORMING PATTERNS

(71) Applicant: SAMSUNG SDI CO., LTD., Yongin-si (KR)

(72) Inventors: Seunghyun Kim, Suwon-si (KR); Yushin Park, Suwon-si (KR); Hyungseok Park, Suwon-si (KR); Sunghwan Kim, Suwon-si (KR); Hyeonil Jung, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 297 days.

(21) Appl. No.: 16/725,191

(22) Filed: Dec. 23, 2019

(65) Prior Publication Data
US 2020/0209754 A1    Jul. 2, 2020

(30) Foreign Application Priority Data

Dec. 26, 2018  (KR) .................. 10-2018-0169795

(51) Int. Cl.
| | | |
|---|---|---|
| *G03F 7/11* | (2006.01) | |
| *C09D 161/12* | (2006.01) | |
| *G03F 7/30* | (2006.01) | |
| *G03F 7/20* | (2006.01) | |
| *G03F 7/16* | (2006.01) | |

(52) U.S. Cl.
CPC .............. *G03F 7/11* (2013.01); *C09D 161/12* (2013.01); *G03F 7/162* (2013.01); *G03F 7/20* (2013.01); *G03F 7/30* (2013.01)

(58) Field of Classification Search
CPC ... G03F 7/11; G03F 7/162; G03F 7/20; G03F 7/30; G03F 7/094; G03F 7/09; C09D 161/12; H01L 21/0271; H01L 21/0274; H01L 21/02118; H01L 21/324; C08L 65/00
USPC ................................................. 430/320, 315
See application file for complete search history.

(56) References Cited

U.S. PATENT DOCUMENTS

2011/0117501 A1* 5/2011 Song ................... C08G 61/02
                                                              430/315
2016/0266494 A1   9/2016 Kim et al.

FOREIGN PATENT DOCUMENTS

| | | |
|---|---|---|
| CN | 108628102 A | 10/2018 |
| JP | 2010-117629 A | 5/2010 |
| JP | 2012-145897 A | 8/2012 |
| JP | 2015-131954 A | 7/2015 |
| JP | 2016-060751 A | 4/2016 |
| KR | 10-0858824 B1 | 9/2008 |
| KR | 10-2013-0130005 A | 11/2013 |
| KR | 10-2015-0045998 A | 4/2015 |
| KR | 10-2015-0069557 A | 6/2015 |
| KR | 10-2015-0125624 A | 11/2015 |
| KR | 10-2016-0006663 A | 1/2016 |
| KR | 10-2016-0023671 A | 3/2016 |
| KR | 10-2016-0033652 A | 3/2016 |
| KR | 10-1687848 B1 | 12/2016 |
| KR | 10-1715952 B1 | 3/2017 |
| KR | 10-1752833 B1 | 6/2017 |
| KR | 10-2017-0087294 A | 7/2017 |
| KR | 10-1775586 B1 | 8/2017 |
| KR | 10-1789353 B1 | 10/2017 |
| KR | 10-2017-0126750 A | 11/2017 |
| KR | 10-2017-0127489 A | 11/2017 |
| KR | 10-1813311 B1 | 12/2017 |
| KR | 10-1824759 B1 | 1/2018 |
| KR | 10-2018-0106833 A | 10/2018 |
| TW | 201811941 A | 4/2018 |
| WO | WO 2016-021594 | 2/2016 |
| WO | WO 2016-208300 A1 | 12/2016 |
| WO | WO 2017-126779 A1 | 7/2017 |

* cited by examiner

*Primary Examiner* — Caleen O Sullivan
(74) *Attorney, Agent, or Firm* — Lee IP Law, P.C.

(57) ABSTRACT

A hardmask composition, a hardmask layer, and a method of forming patterns, the composition including a solvent; and a polymer including a structural unit represented by Chemical Formula 1,

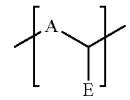

[Chemical Formula 1]

wherein, in Chemical Formula 1, A is a substituted or unsubstituted dihydroxypyrene moiety, and E is a substituted or unsubstituted pyrenyl group.

12 Claims, No Drawings

HARDMASK COMPOSITION, HARDMASK LAYER AND METHOD OF FORMING PATTERNS

CROSS-REFERENCE TO RELATED APPLICATION

Korean Patent Application No. 10-2018-0169795, filed on Dec. 26, 2018, in the Korean Intellectual Property Office, and entitled: "Hardmask Composition, Hardmask Layer and Method of Forming Patterns," is incorporated by reference herein in its entirety.

BACKGROUND

1. Field

Embodiments provide a hardmask composition, a hardmask layer, and a method of forming patterns.

2. Description of the Related Art

The semiconductor industry has developed to include an ultra-fine technique having a pattern of several to several tens of nanometer size. Such an ultrafine technique utilizes effective lithographic techniques.

Some lithographic techniques may include providing a material layer on a semiconductor substrate; coating a photoresist layer thereon; exposing and developing the same to provide a photoresist pattern; and etching a material layer using the photoresist pattern as a mask.

SUMMARY

The embodiments may be realized by providing a hardmask composition including a solvent; and a polymer including a structural unit represented by Chemical Formula 1,

[Chemical Formula 1]

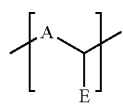

wherein, in Chemical Formula 1, A is a substituted or unsubstituted dihydroxypyrene moiety, and E is a substituted or unsubstituted pyrenyl group.

A may be a substituted or unsubstituted divalent group of Group 1:

[Group 1]

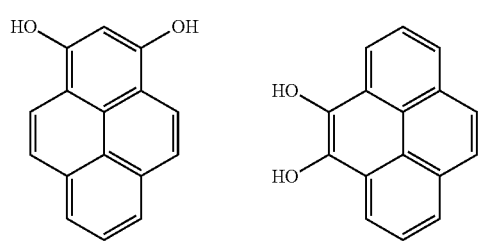

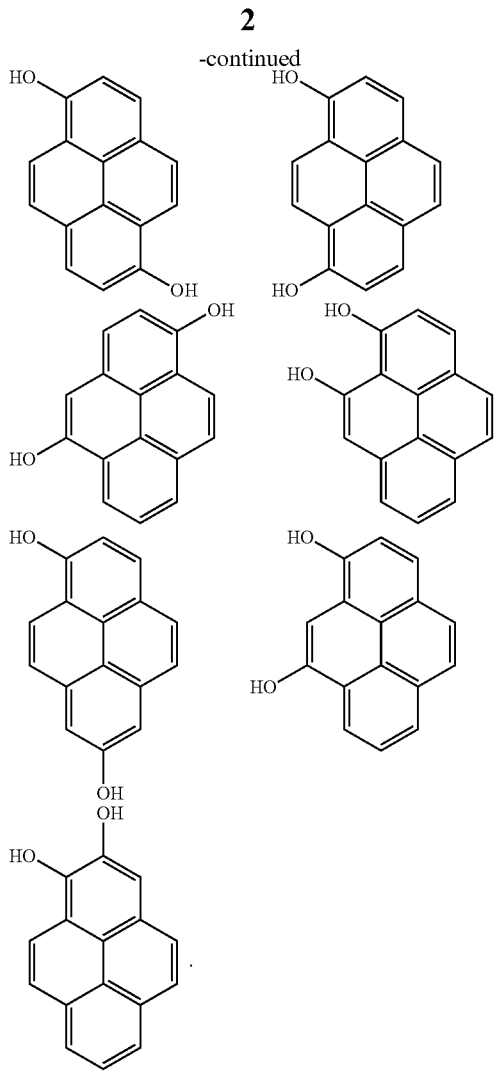

E may be an unsubstituted pyrenyl group, or a pyrenyl group substituted with a substituent, the substituent being deuterium, a halogen, a nitro group, an amino group, a hydroxy group, a substituted or unsubstituted C1 to C30 alkoxy group, a substituted or unsubstituted C1 to C30 alkyl group, a substituted or unsubstituted C1 to C30 alkenyl group, a substituted or unsubstituted C1 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

E may be a monovalent group of Group 2:

[Group 2]

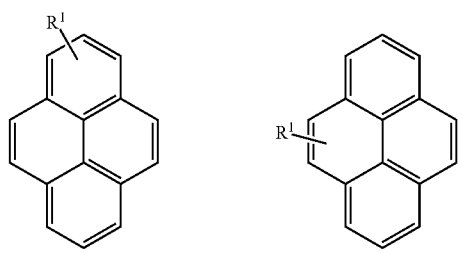

-continued

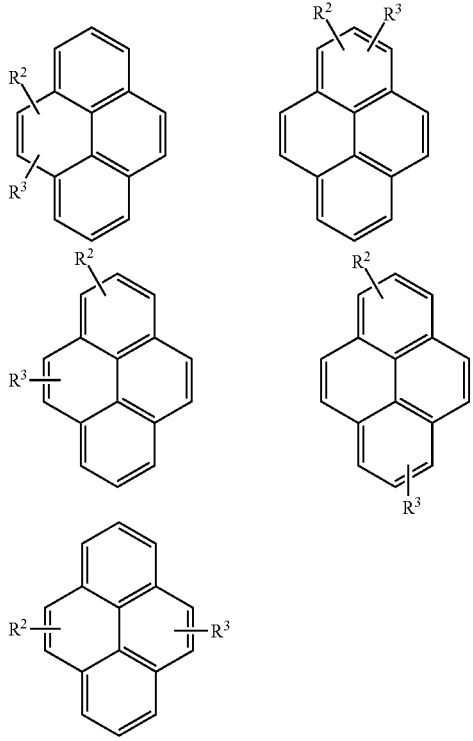

wherein, in Group 2, $R^1$ to $R^3$ may independently be hydrogen, deuterium, a halogen, a nitro group, an amino group, a hydroxy group, a substituted or unsubstituted C1 to C30 alkoxy group, a substituted or unsubstituted C1 to C30 alkyl group, a substituted or unsubstituted C1 to C30 alkenyl group, a substituted or unsubstituted C1 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

E may be a 1-hydroxy pyrenyl group or a pyrenyl group.

The structural unit represented by Chemical Formula 1 may be represented by Chemical Formula 2 or Chemical Formula 3:

[Chemical Formula 2]

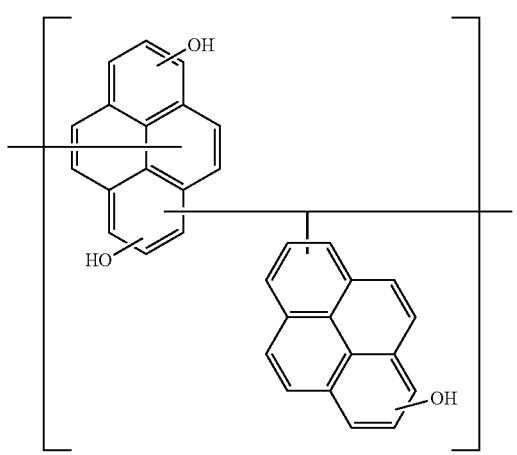

[Chemical Formula 3]

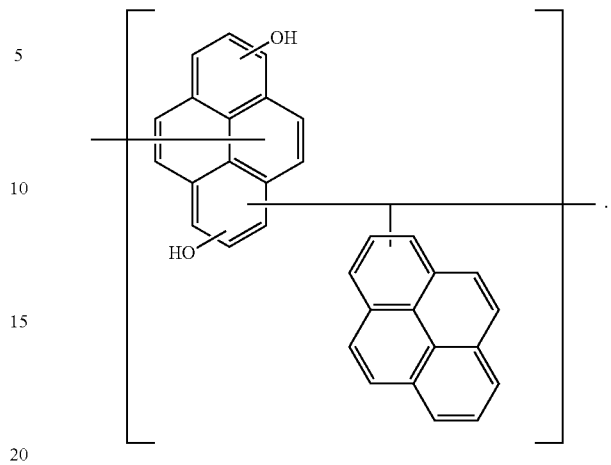

The structural unit may be obtained by a reaction of a substituted or unsubstituted dihydroxy pyrene and a substituted or unsubstituted pyrene carboxaldehyde.

The substituted or unsubstituted dihydroxy pyrene may be a substituted or unsubstituted compound of Group 1':

[Group 1']

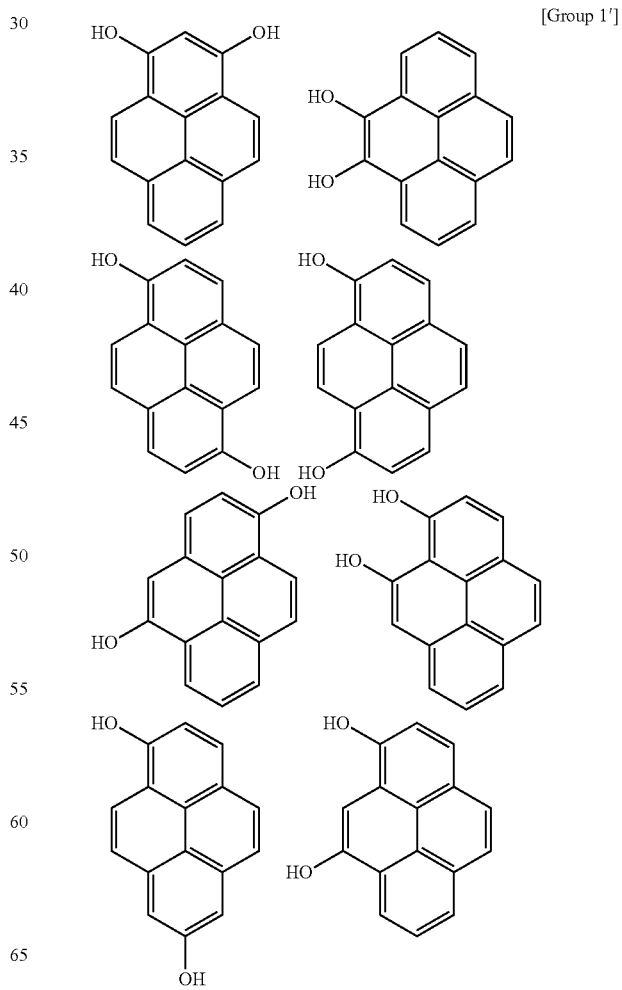

-continued

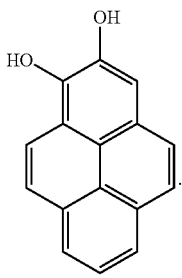

The substituted or unsubstituted pyrene carboxaldehyde may include a moiety of Group 2':

[Group 2']

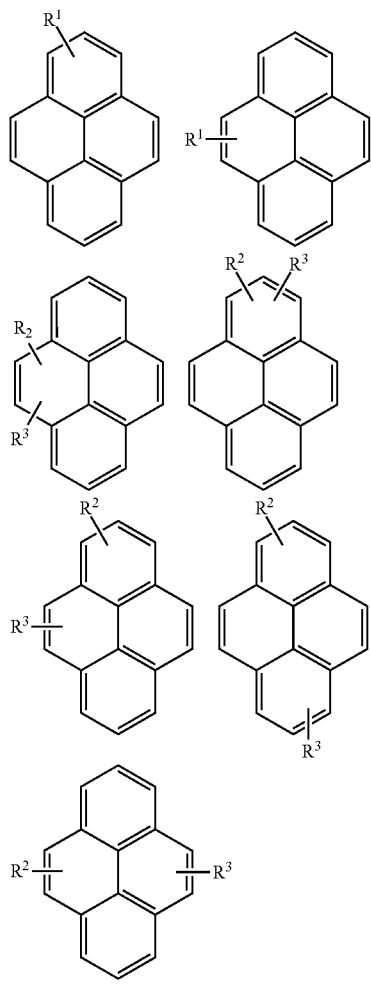

wherein, in Group 2', $R^1$ to $R^3$ may independently be hydrogen, deuterium, a halogen, a nitro group, an amino group, a hydroxy group, a substituted or unsubstituted C1 to C30 alkoxy group, a substituted or unsubstituted C1 to C30 alkyl group, a substituted or unsubstituted C1 to C30 alkenyl group, a substituted or unsubstituted C1 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

The embodiments may be realized by providing a hardmask layer comprising a cured product of the hardmask composition according to an embodiment.

The cured product may include a condensed polycyclic aromatic hydrocarbon.

The embodiments may be realized by providing a method of forming patterns, the method including applying the hardmask composition according to an embodiment on a material layer and heat-treating the resultant to form a hardmask layer, forming a photoresist layer on the hardmask layer, exposing and developing the photoresist layer to form a photoresist pattern, selectively removing the hardmask layer using the photoresist pattern to expose a portion of the material layer, and etching the exposed portion of the material layer.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when a definition is not otherwise provided, "substituted" refers to replacement of a hydrogen atom of a compound by a substituent selected from deuterium, a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C30 heterocyclic group, and a combination thereof.

In addition, two adjacent substituents of the substituted halogen atom (F, Br, Cl, or I), hydroxy group, nitro group, cyano group, amino group, azido group, amidino group, hydrazino group, hydrazono group, carbonyl group, carbamyl group, thiol group, ester group, carboxyl group or salt thereof, sulfonic acid group or salt thereof, phosphoric acid group or salt thereof, C1 to C30 alkyl group, C2 to C30 alkenyl group, C2 to C30 alkynyl group, C6 to C30 aryl group, C7 to C30 arylalkyl group, C1 to C30 alkoxy group, C1 to C20 heteroalkyl group, C3 to C20 heteroarylalkyl group, C3 to C30 cycloalkyl group, C3 to C15 cycloalkenyl group, C6 to C15 cycloalkynyl group, and C2 to C30 heterocyclic group may be fused to form a ring. For example, the substituted C6 to C30 aryl group may be fused with another adjacent substituted C6 to C30 aryl group to form a substituted or unsubstituted fluorene ring.

As used herein, when a definition is not otherwise provided, "hetero" refers to one including 1 to 3 heteroatoms selected from N, O, S, Se, and P.

As used herein, "aryl group" may refer to a group including at least one hydrocarbon aromatic moiety, and includes hydrocarbon aromatic moieties linked by a single bond and hydrocarbon aromatic moieties fused directly or indirectly to provide a non-aromatic fused ring. The aryl group may include a monocyclic, polycyclic, or fused polycyclic (i.e., rings sharing adjacent pairs of carbon atoms) functional group.

As used herein, "heterocyclic group" is a concept including a heteroaryl group, and may include at least one hetero atom selected from N, O, S, P, and Si instead of carbon (C) in a cyclic compound such as an aryl group, a cycloalkyl group, a fused ring thereof, or a combination thereof. When the heterocyclic group is a fused ring, the entire ring or each ring of the heterocyclic group may include one or more heteroatoms.

More specifically, the substituted or unsubstituted aryl group and/or the substituted or unsubstituted heterocyclic group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted terphenyl group, a substituted or unsubstituted quaterphenyl group, a substituted or unsubstituted chrysenyl group, a substituted or unsubstituted triphenylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridinyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted fluorenyl group, a substituted or unsubstituted dibenzofuranyl group, a substituted or unsubstituted dibenzothiophenyl group, a substituted or unsubstituted carbazolyl group, a substituted or unsubstituted pyridoindolyl group, a substituted or unsubstituted benzopyridooxazinyl group, a substituted or unsubstituted benzopyridothiazinyl group, a substituted or unsubstituted 9,9-dimethyl 9,10 dihydroacridinyl group, a combination thereof, or a combined fused ring of the foregoing groups. In one example, the heterocyclic group or the heteroaryl group may be a pyridyl group, a carbazolyl group, or a pyridoindolyl group.

As used herein, a polymer means oligomer and a polymer.

Hereinafter, a hardmask composition according to an embodiment is described.

A hardmask composition according to an embodiment may include, e.g., a polymer and a solvent.

The polymer may include, e.g., a main chain including an aromatic ring substituted with two hydroxy groups and a side chain bound to the main chain and including an aromatic ring.

In an implementation, the main chain including the aromatic ring substituted with two hydroxy groups may include a condensed aromatic ring substituted with two hydroxy groups, e.g., a substituted or unsubstituted dihydroxy pyrene moiety.

The side chain including the aromatic ring may be bonded to the main chain at a tertiary carbon, so that the polymer may include a tertiary carbon to increase solubility in a solvent as well as to increase a carbon content, forming a rigid polymer layer and imparting high etch resistance.

In an implementation, the side chain including the aromatic ring may include a condensed aromatic ring, e.g., a substituted or unsubstituted pyrenyl group.

In an implementation, the polymer may include, e.g., a structural unit represented by Chemical Formula 1.

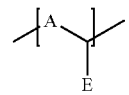

[Chemical Formula 1]

In Chemical Formula 1,

A may be or may include, e.g., a substituted or unsubstituted dihydroxypyrene moiety (e.g., a divalent group), and E may be or may include, e.g., a substituted or unsubstituted pyrenyl group (e.g., a monovalent group).

In A of Chemical Formula 1, 'substituted' means further including other substituents in addition to the two hydroxy groups, and 'unsubstituted' means not further including the other substituents in addition to the two hydroxy groups (e.g., but still being substituted with the two hydroxy groups).

The polymer may include a substituted or unsubstituted dihydroxy pyrene moiety in the main chain and thus may help increase solubility in a solvent and accordingly, may be effectively applied to a solution such as spin coating. In addition, it may help increase a carbon content and thus a rigid polymer layer may be formed, and accordingly, a polymer layer having excellent layer density as well as improved etch resistance may be provided.

In an implementation, in A of Chemical Formula 1, two hydroxy groups of the substituted or unsubstituted dihydroxy pyrene moiety may be all on the same ring among rings in pyrene, or may be on different rings among the rings in pyrene. In an implementation, the two hydroxy groups may be on rings facing each other or rings neighboring each other among the rings in pyrene.

The polymer may include a pyrene moiety having the two (e.g., only two) hydroxy groups in the main chain and may help form a polymer layer having much higher etch resistance against $CF_x$ etching gas than a polymer including a pyrene moiety having at least three hydroxy groups in the main chain.

In an implementation, A of Chemical Formula 1 may include, e.g., a substituted or unsubstituted divalent group of Group 1 (e.g., a divalent group of the compounds of Group 1).

[Group 1]

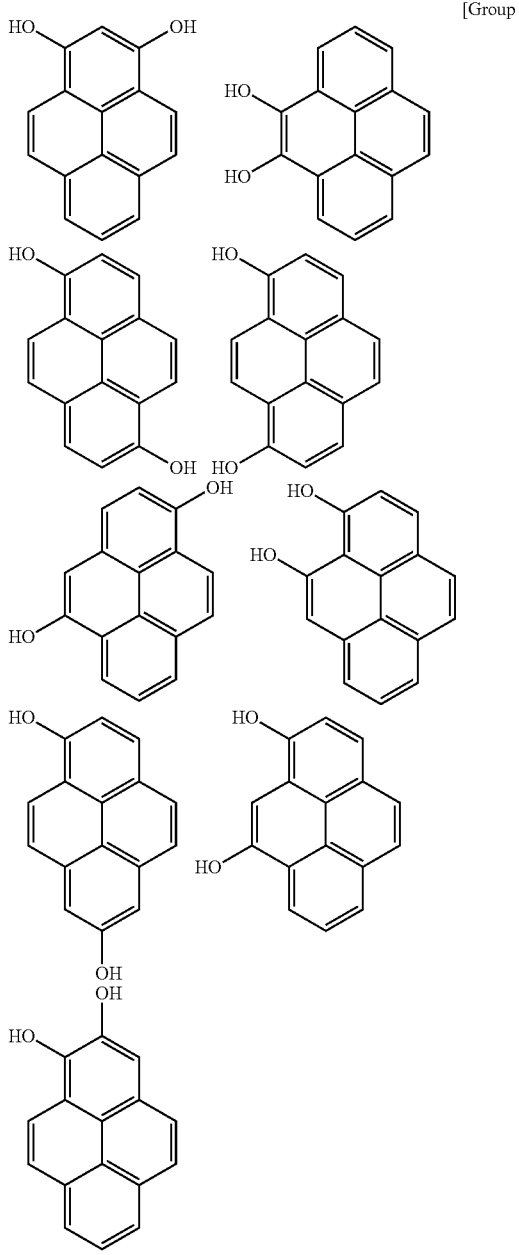

In an implementation, the polymer may include the above-described substituted or unsubstituted dihydroxy pyrene moiety (A) in the main chain and the substituted or unsubstituted pyrenyl group (E) in the side chain, and may help secure sufficient solubility effectively applicable to the solution process such as spin-coating and simultaneously, a sufficient carbon content capable of forming a rigid polymer layer.

In an implementation, E may be, e.g., an unsubstituted pyrenyl group or a pyrenyl group substituted with at least one substituent that is the same or different.

In an implementation, each substituent of the substituted pyrenyl group may independently include, e.g., deuterium, a halogen, a nitro group, an amino group, a hydroxy group, a substituted or unsubstituted C1 to C30 alkoxy group, a substituted or unsubstituted C1 to C30 alkyl group, a substituted or unsubstituted C1 to C30 alkenyl group, a substi-tuted or unsubstituted C1 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

In an implementation, in E of Chemical Formula 1, two adjacent substituents may be separately present, or the adjacent two may be linked with each other to form a ring.

In an implementation, in E of Chemical Formula 1, the at least one substituent may all substitute the same ring among rings of pyrene, or may substitute a different ring among rings of pyrene.

In an implementation, E may be an unsubstituted pyrenyl group, a pyrenyl group substituted with one substituent, or a pyrenyl group substituted with two substituents.

In an implementation, E may be a pyrenyl group substituted with two substituents, the two substituents may be the same or different from each other, and the two substituents may be separately present or linked with each other to form a ring.

In an implementation, E may be a pyrenyl group substituted with two substituents, the two substituents may be respectively substituted in the same ring or different rings among rings in pyrene, e.g., may face or neighbor each other among the rings.

In an implementation, E may be a pyrenyl group substituted with at least one hydroxy group.

In an implementation, E may be a pyrenyl group substituted with at least one hydroxy group or at least one substituted or unsubstituted C1 to C30 alkyl group.

In an implementation, the substituted or unsubstituted C1 to C30 alkyl group may include, e.g., a substituted or unsubstituted methyl group, a substituted or unsubstituted ethyl group, a substituted or unsubstituted propyl group, a substituted or unsubstituted butyl group, or a substituted or unsubstituted pentyl group.

In an implementation, the substituted or unsubstituted C1 to C30 alkyl group may include, e.g., a substituted or unsubstituted methyl group, a substituted or unsubstituted ethyl group, a substituted or unsubstituted n-propyl group, a substituted or unsubstituted iso-propyl group, a substituted or unsubstituted n-butyl group, a substituted or unsubstituted iso-butyl group, a substituted or unsubstituted sec-butyl group, a substituted or unsubstituted tert-butyl group, a substituted or unsubstituted n-pentyl group, a substituted or unsubstituted iso-pentyl group, a substituted or unsubstituted sec-pentyl group, a substituted or unsubstituted tert-pentyl group, or a substituted or unsubstituted neo-pentyl group.

In an implementation, E may be any a monovalent group of Group 2 (e.g., may be a monovalent group of the compounds of Group 2).

[Group 2]

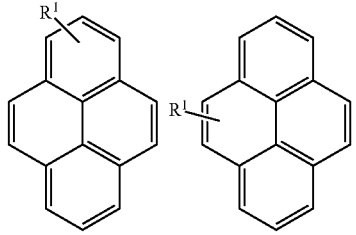

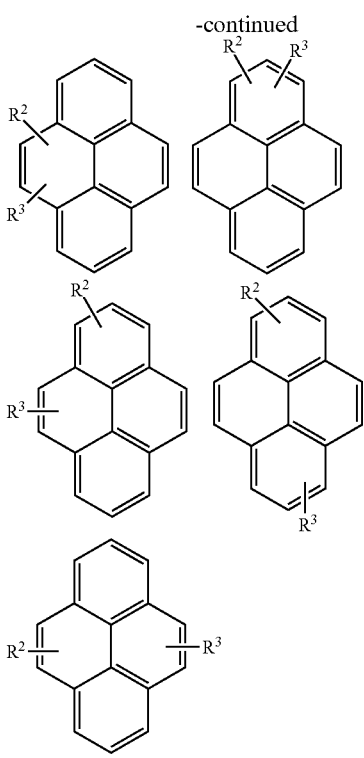

In Group 2, $R^1$ to $R^3$ may each independently be, e.g., hydrogen, deuterium, a halogen, a nitro group, an amino group, a hydroxy group, a substituted or unsubstituted C1 to C30 alkoxy group, a substituted or unsubstituted C1 to C30 alkyl group, a substituted or unsubstituted C1 to C30 alkenyl group, a substituted or unsubstituted C1 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

In an implementation, $R^1$ may be, e.g., hydrogen, a hydroxy group, or a substituted or unsubstituted C1 to C30 alkyl group.

In an implementation, the substituted or unsubstituted C1 to C30 alkyl group may be, e.g., a substituted or unsubstituted methyl group, a substituted or unsubstituted ethyl group, a substituted or unsubstituted propyl group, a substituted or unsubstituted butyl group, or a substituted or unsubstituted pentyl group.

In an implementation, the substituted or unsubstituted C1 to C30 alkyl group may be, e.g., a substituted or unsubstituted methyl group, a substituted or unsubstituted ethyl group, a substituted or unsubstituted n-propyl group, a substituted or unsubstituted iso-propyl group, a substituted or unsubstituted n-butyl group, a substituted or unsubstituted iso-butyl group, a substituted or unsubstituted sec-butyl group, a substituted or unsubstituted tert-butyl group, a substituted or unsubstituted n-pentyl group, a substituted or unsubstituted iso-pentyl group, a substituted or unsubstituted sec-pentyl group, a substituted or unsubstituted tert-pentyl group, or a substituted or unsubstituted neo-pentyl group.

In an implementation, $R^2$ and $R^3$ may be the same or different.

In an implementation, $R^2$ and $R^3$ may be separate or may be linked with each other to form a ring.

In an implementation, $R^2$ and $R^3$ may be hydrogen, $R^2$ and $R^3$ may be a hydroxy group, or $R^2$ may be hydrogen and $R^3$ may be a hydroxy group.

In an implementation, E may be, e.g., a pyrenyl group, a hydroxypyrenyl group, or a dihydroxypyrenyl group. In an implementation, E may be, e.g., a 1-hydroxy pyrenyl group or a pyrenyl group.

In an implementation, the structural unit represented by Chemical Formula 1 may be represented by, e.g., Chemical Formula 2 or Chemical Formula 3.

[Chemical Formula 2]

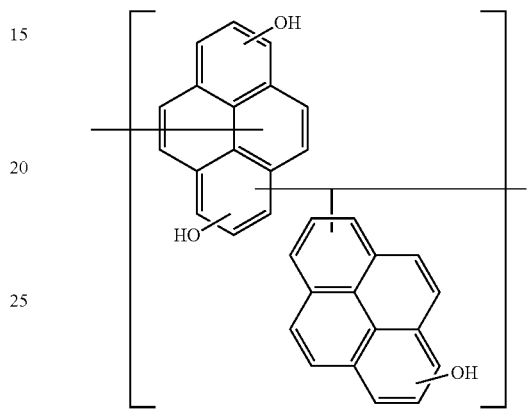

[Chemical Formula 3]

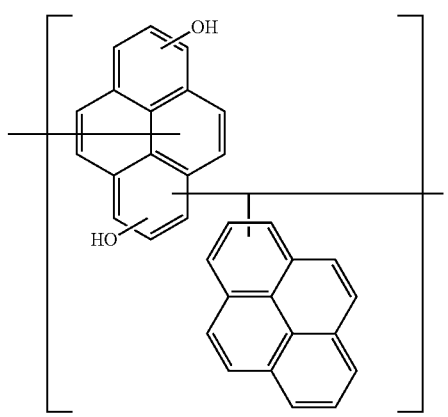

In an implementation, the polymer may include a structural unit obtained by, e.g., a reaction of a substituted or unsubstituted dihydroxy pyrene and a substituted or unsubstituted pyrene carboxaldehyde.

The reaction may be a condensation reaction.

The substituted dihydroxy pyrene may be further substituted, e.g., may have other substituents in addition to the two hydroxy groups, and the unsubstituted dihydroxy pyrene may not further have any other substituents (besides the two hydroxy groups).

The two hydroxy groups of the substituted or unsubstituted dihydroxy pyrene may be the same ring or in different rings among the rings in pyrene. In an implementation, the rings may be facing or neighboring each other among the rings.

In an implementation, the substituted or unsubstituted dihydroxy pyrene may be a substituted or unsubstituted compound of Group 1' (e.g., the compound may be further substituted, in addition to the hydroxy groups of the compounds of Group 1').

[Group 1']

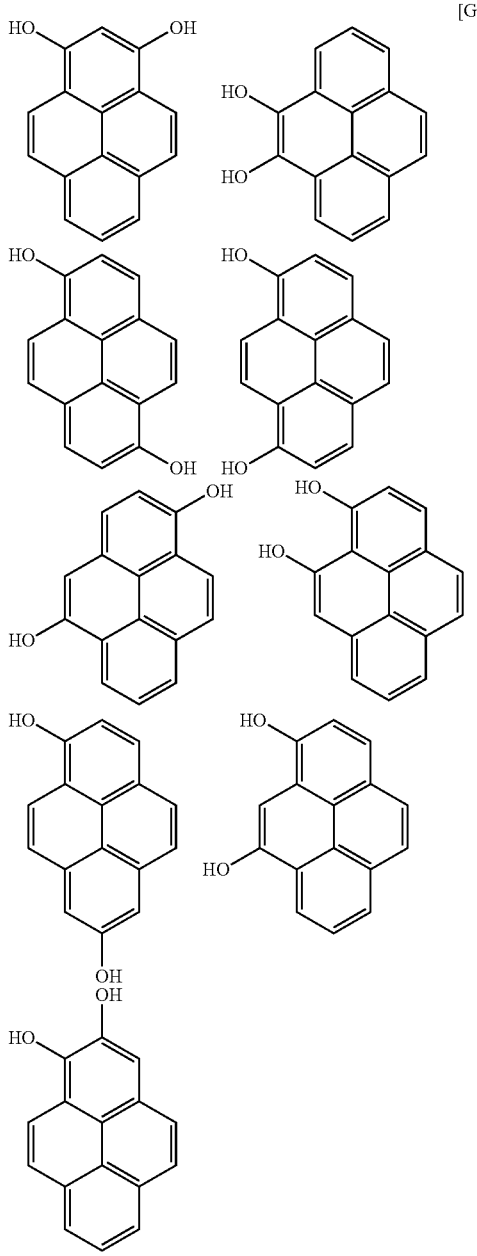

In an implementation, the substituted or unsubstituted pyrene carboxaldehyde may be, e.g., unsubstituted pyrene carboxaldehyde, or pyrene carboxaldehyde substituted with at least one substituent that is the same or different.

In an implementation, each substituent may independently be, e.g., deuterium, a halogen, a nitro group, an amino group, a hydroxy group, a substituted or unsubstituted C1 to C30 alkoxy group, a substituted or unsubstituted C1 to C30 alkyl group, a substituted or unsubstituted C1 to C30 alkenyl group, a substituted or unsubstituted C1 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

In an implementation, in the substituted pyrene carboxaldehyde, two adjacent substituents may be separate or the adjacent two may be linked with each other to form a ring.

In an implementation, in the substituted pyrene carboxaldehyde, two or more substituents may be respectively substituted on the same ring or different rings among the rings in pyrene, e.g., the rings facing or neighboring each other among the rings in pyrene.

In an implementation, the substituted or unsubstituted pyrene carboxaldehyde may be, e.g., unsubstituted pyrene carboxaldehyde, a pyrene carboxaldehyde substituted with one substituent, or a pyrene carboxaldehyde substituted with two substituents.

In an implementation, when the substituted pyrene carboxaldehyde is a pyrene carboxaldehyde substituted two substituents, the two substituents may be the same or different and the two substituents may be separate or linked with each other to form a ring.

In an implementation, when the substituted pyrene carboxaldehyde is pyrene carboxaldehyde substituted with two substituents, the two substituents may be respectively substituted on the same ring or different rings among the rings in pyrene, e.g., the rings facing or neighboring each other among the rings in pyrene.

In an implementation, the substituted pyrene carboxaldehyde may be, e.g., a pyrene carboxaldehyde substituted with at least one hydroxy group or at least one substituted or unsubstituted C1 to C30 alkyl group.

In an implementation, the substituted or unsubstituted C1 to C30 alkyl group may be, e.g., a substituted or unsubstituted methyl group, a substituted or unsubstituted ethyl group, a substituted or unsubstituted propyl group, a substituted or unsubstituted butyl group, or a substituted or unsubstituted pentyl group.

In an implementation, the substituted or unsubstituted C1 to C30 alkyl group may be, e.g., a substituted or unsubstituted methyl group, a substituted or unsubstituted ethyl group, a substituted or unsubstituted n-propyl group, a substituted or unsubstituted iso-propyl group, a substituted or unsubstituted n-butyl group, a substituted or unsubstituted iso-butyl group, a substituted or unsubstituted sec-butyl group, a substituted or unsubstituted tert-butyl group, a substituted or unsubstituted n-pentyl group, a substituted or unsubstituted iso-pentyl group, a substituted or unsubstituted sec-pentyl group, a substituted or unsubstituted tert-pentyl group, or a substituted or unsubstituted neo-pentyl group.

In an implementation, the substituted or unsubstituted pyrene carboxaldehyde may include a moiety of Group 2'.

[Group 2']

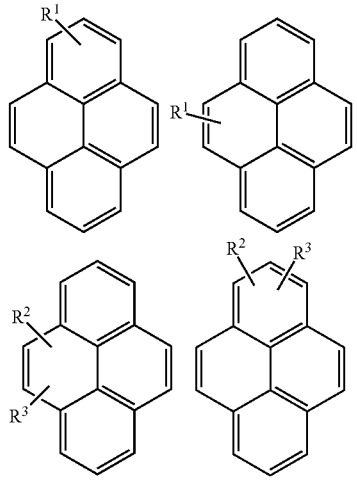

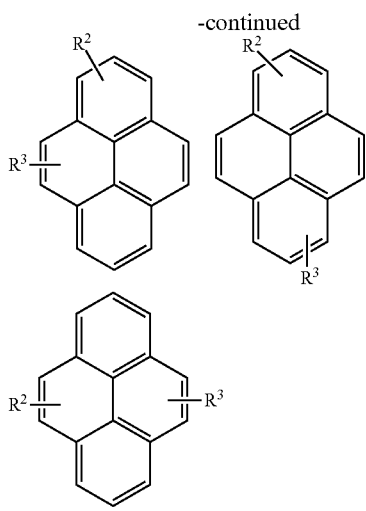

In Group 2', $R^1$ to $R^3$ may be the same as described above with respect to Group 2.

In an implementation, the substituted or unsubstituted pyrene carboxaldehyde may include, e.g., pyrene, hydroxypyrene, or dihydroxy pyrene. In an implementation, the substituted or unsubstituted pyrene carboxaldehyde may include, e.g., 1-hydroxy pyrene or pyrene.

In an implementation, the polymer may include one or more of the structural unit represented by Chemical Formula 1, and may include it as a plurality of repeating units. When the structural unit represented by Chemical Formula 1 exists as a plurality of repeating units, the number and arrangement of the repeating unit may be a suitable number and arrangement.

The polymer may have a weight average molecular weight of, e.g., about 500 to about 200,000. In an implementation, the polymer may have a weight average molecular weight of, e.g., about 1,000 to about 100,000, about 1,200 to about 50,000, or about 1,500 to about 10,000. When the polymer has the average molecular weight within the ranges, a carbon content of the polymer and solubility of the solvent may be adjusted to be optimized.

In an implementation, the solvent included in the hardmask composition may be a suitable solvent, e.g., may have sufficient dissolution or dispersion with respect to the polymer. In an implementation, the solvent may include, e.g., propylene glycol, propylene glycol diacetate, methoxy propanediol, diethylene glycol, diethylene glycol butyl ether, tri(ethylene glycol)monomethylether, propylene glycol monomethylether, propylene glycol monomethylether acetate, cyclohexanone, ethyl lactate, gamma-butyrolactone, N,N-dimethyl formamide, N,N-dimethyl acetamide, methylpyrrolidone, methylpyrrolidinone, acetylacetone, or ethyl 3-ethoxypropionate.

The polymer may be included in an amount of, e.g., about 0.1 wt % to about 50 wt %, about 0.5 wt % to about 40 wt %, about 1 wt % to about 30 wt %, or about 3 wt % to about 20 wt %, based on a total weight of the hardmask composition. When the polymer is included within the range, a thickness, surface roughness and planarization of the hardmask may be controlled.

The hardmask composition may further include an additive, e.g., a surfactant, a cross-linking agent, a thermal acid generator, a plasticizer, or the like.

In an implementation, the surfactant may include, e.g., a fluoroalkyl-based compound, an alkylbenzene sulfonate salt, an alkyl pyridinium salt, polyethylene glycol, or a quaternary ammonium salt.

In an implementation, the cross-linking agent may be, e.g., a melamine-based, substituted urea-based, or a polymer-based cross-linking agent. In an implementation, the cross-linking agent may have at least two cross-linking forming substituents, e.g., methoxymethylated glycoluril, butoxymethylated glycoluril, methoxymethylated melamine, butoxymethylated melamine, methoxymethylated benzoguanamine, butoxymethylated benzoguanamine, methoxymethylatedurea, butoxymethylatedurea, methoxymethylated thiourea, or butoxymethylated thiourea.

The cross-linking agent may be a cross-linking agent having high heat resistance. The cross-linking agent having high heat resistance may be a compound including a cross-linking substituent including an aromatic ring (e.g. a benzene ring or a naphthalene ring) in the molecule.

In an implementation, the thermal acid generator may be, e.g., p-toluene sulfonic acid, trifluoromethanesulfonic acid, pyridiniump-toluenesulfonic acid, salicylic acid, sulfosalicylic acid, citric acid, benzoic acid, hydroxybenzoic acid, naphthalenecarbonic acid, 2,4,4,6-tetrabromocyclohexadienone, benzointosylate, 2-nitrobenzyltosylate, other organosulfonic acid alkylesters, or the like.

The additive may be included in an amount of, e.g., about 0.001 parts by weight to about 40 parts by weight, about 0.01 parts by weight to about 30 parts by weight, or about 0.1 parts by weight to about 20 parts by weight, based on 100 parts by weight of the hardmask composition. Within the ranges, solubility may be improved while optical properties of the hardmask composition are not changed.

According to another embodiment, an organic layer manufactured using the aforementioned hardmask composition may be provided. The organic layer may be, e.g., formed by coating the aforementioned hardmask composition on a substrate and heat-treating it for curing and may include, for example, a hardmask layer, a planarization layer, a sacrificial layer, a filler, and the like for an electronic device.

According to another embodiment, a hardmask layer including a cured product of the aforementioned hardmask composition may be provided.

In an implementation, the cured product may include a condensed polycyclic aromatic hydrocarbon.

In an implementation, the condensed polycyclic aromatic hydrocarbon may include, e.g., a substituted or unsubstituted naphthalene, a substituted or unsubstituted anthracene, a substituted or unsubstituted phenanthrene, a substituted or unsubstituted naphthacene, a substituted or unsubstituted pyrene, a substituted or unsubstituted chrysene, a substituted or unsubstituted triphenylene, a substituted or unsubstituted perylene, a combination thereof, or a combined fused ring of the foregoing groups.

In an implementation, the cured product may further include a heterocycle.

The cured product may include the condensed polycyclic aromatic hydrocarbons, which may withstand the etching gases and chemicals exposed in subsequent processes, including the etching process due to high etch resistance.

Hereinafter, a method of forming a pattern using the aforementioned hardmask composition described above is described.

A method of forming patterns according to an embodiment may include forming a material layer on a substrate, applying the hardmask composition including the polymer and a solvent on the material layer, heat-treating the hardmask composition to form a hardmask layer, forming a photoresist layer on the hardmask layer, exposing and developing the photoresist layer to form a photoresist pattern, selectively removing the hardmask layer using the photoresist pattern to expose a portion of the material layer, and etching an exposed portion of the material layer.

The substrate may be, e.g., a silicon wafer, a glass substrate, or a polymer substrate.

The material layer may be a material to be finally patterned, e.g., a metal layer such as an aluminum layer or a copper layer, a semiconductor layer such as a silicon layer, or an insulation layer such as a silicon oxide layer or a silicon nitride layer. The material layer may be formed through a method such as a chemical vapor deposition (CVD) process.

The hardmask composition may be the same as described above, and may be applied by spin-on coating in a form of a solution. In an implementation, an application thickness of the hardmask composition may be, e.g., about 50 Å to about 200,000 Å.

The heat-treating of the hardmask composition may be performed, e.g., at about 100° C. to about 700° C. for about 10 seconds to about 1 hour.

In an implementation, the method may further include forming a silicon-containing thin layer on the hardmask layer. The silicon-containing thin layer may be formed of a material, e.g., SiCN, SiOC, SiON, SiOCN, SiC, SiO, SiN, or the like.

In an implementation, the method may further include forming a bottom antireflective coating (BARC) on the upper surface of the silicon-containing thin layer or on the upper surface hardmask layer before forming the photoresist layer.

Exposure of the photoresist layer may be performed using, e.g., ArF, KrF, or EUV. After exposure, heat-treating may be performed at about 100° C. to about 700° C.

The etching process of the exposed portion of the material layer may be performed through a dry etching process using an etching gas and the etching gas may be, e.g., $CHF_3$, $CF_4$, $Cl_2$, $BCl_3$, or a mixed gas thereof.

The etched material layer may be formed in a plurality of patterns, and the plurality of patterns may be a metal pattern, a semiconductor pattern, an insulation pattern, or the like, e.g., diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Polymer

Synthesis Example 1

1,6-dihydroxy pyrene (23 g, 0.1 mol), 1-hydroxypyrene-6-carboxaldehyde (24 g, 0.1 mol), and para-toluene sulfonic acid (pTSA, 1 g) were put in a 1 L 2-necked round-bottomed flask equipped with a mechanical stirrer and a condenser, 112 g of propylene glycol monomethyl ether acetate (PGMEA) was added thereto, and the mixture was stirred at 110° C. for 12 hours to perform a polymerization reaction. When the polymerization reaction was complete, water was added thereto to remove salt, and the reactant was concentrated with an evaporator. The concentrated reactant was diluted with cyclohexanone to be 15 wt % based on an entire amount of the solution, and a solid precipitated by adding hexane thereto was filtered to obtain a polymer including a structural unit represented by Chemical Formula 1a.

[Chemical Formula 1a]

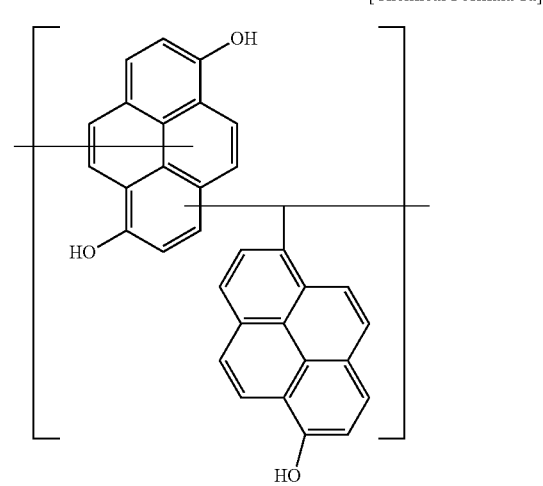

Synthesis Example 2

A polymer including a structural unit represented by Chemical Formula 1b was prepared according to the same method as Synthesis Example 1 except that pyrene carboxaldehyde (23 g, 0.1 mol) was used instead of the 1-hydroxypyrene-6-carboxaldehyde (24 g, 0.1 mol).

[Chemical Formula 1b]

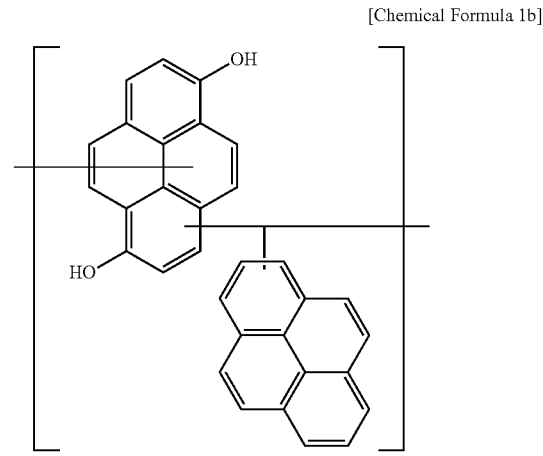

Comparative Synthesis Example 1

A polymer including a structural unit represented by Chemical Formula A was prepared according to the same method as Synthesis Example 1 except that pyrene (20 g, 0.1 mol) instead of the 1,6-dihydroxy pyrene (23 g, 0.1 mol) and pyrene carboxaldehyde (23 g, 0.1 mol) instead of the 1-hydroxypyrene-6-carboxaldehyde (24 g, 0.1 mol) were used.

[Chemical Formula A]

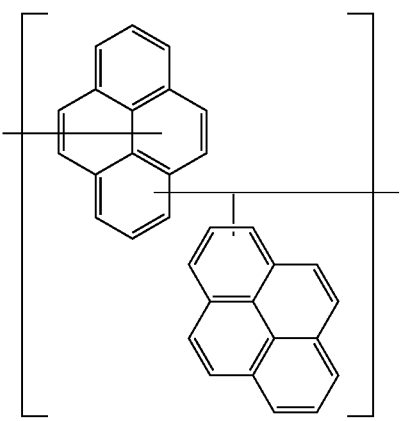

Comparative Synthesis Example 2

A polymer including a structural unit represented by Chemical Formula B was prepared according to the same method as Synthesis Example 1 except that 1-hydroxypyrene (22 g, 0.1 mol) was used instead of the 1,6-dihydroxypyrene (23 g, 0.1 mol).

[Chemical Formula B]

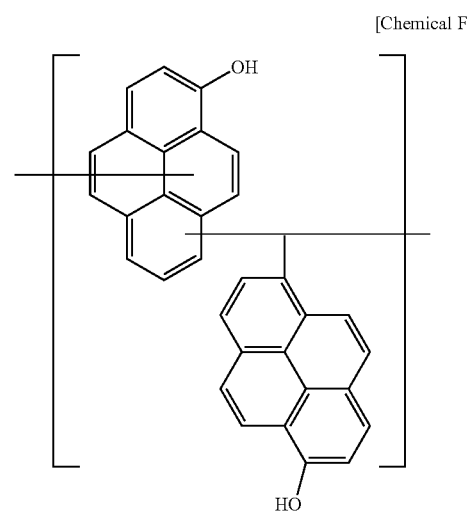

Preparation of Hardmask Composition

Example 1

A hardmask composition was prepared by uniformly dissolving 1.2 g of the polymer including a structural unit represented by Chemical Formula 1a in 10 g of propylene glycol monomethyl ether acetate (PGMEA) and filtering the solution with a 0.1 μm TEFLON (tetrafluoroethylene) filter.

Example 2

A hardmask composition was prepared according to the same method as Synthesis Example 1 by using 1.2 g of the polymer including a structural unit represented by Chemical Formula 1b instead of 1.2 g of the polymer including a structural unit represented by Chemical Formula 1a.

Comparative Example 1

A hardmask composition was prepared by dissolving 1.2 g of the polymer including a structural unit represented by Chemical Formula A according to Comparative Synthesis Example 1 in 10 g of cyclohexanone and filtering the solution with a 0.1 μm TEFLON (tetrafluoroethylene) filter.

Comparative Example 2

A hardmask composition was prepared according to the same method as Comparative Example 1 except that 1.2 g of the polymer including a structural unit represented by Chemical Formula B according to Comparative Synthesis Example 2 was used instead of the polymer including a structural unit represented by Chemical Formula A according to Comparative Synthesis Example 1.

Evaluation 1: Etch Resistance

The hardmask compositions according to Examples 1 and 2 and Comparative Examples 1 and 2 were respectively spin-coated on a silicon wafer and then, heat-treated at about 400° C. for 120 seconds to form organic layers.

Thicknesses of the organic layers were measured, and subsequently, the organic layers were dry-etched by using $CF_x$ gas and $N_2/O_2$ gas respectively for 120 seconds and 60 seconds, and then, thicknesses thereof were measured.

The thicknesses of the organic layers before and after the dry etching and their etching times were used to calculate a bulk etch rate (BER) according to Calculation Equation 1.

Etch rate (Å/s)=(Initial organic layer thickness−Organic layer thickness after etching)/Etching time [Calculation Equation 1]

The results are shown in Table 1.

TABLE 1

| | $CF_x$ Bulk etch rate(Å/s) | $N_2/O_2$ Bulk etch rate (Å/s) |
|---|---|---|
| Example 1 | 25.3 | 20.8 |
| Example 2 | 25.4 | 21.2 |
| Comparative Example 1 | 28.1 | 25.0 |
| Comparative Example 2 | 26.5 | 24.5 |

Referring to Table 1, the layers of Examples 1 and 2 exhibited improved etch resistance in terms of sufficient etch resistance against etching gas, compared with the layers of Comparative Examples 1 and 2.

By way of summation and review, when the patterns to be formed with reduced sizes, providing a fine pattern having an excellent profile only using lithographic techniques may be difficult. An auxiliary layer, called a hardmask layer, may be formed between the material layer and the photoresist layer to provide a fine pattern.

One or more embodiments may provide a hardmask composition capable of improving etch resistance. A hardmask layer may include a cured product of the hardmask composition.

Etch resistance of the hardmask layer may be secured simultaneously.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A hardmask composition, comprising:

a solvent; and a polymer including a structural unit represented by Chemical Formula 1,

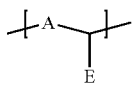

[Chemical Formula 1]

wherein, in Chemical Formula 1,

A is a substituted or unsubstituted dihydroxypyrene moiety, and

E is a substituted or unsubstituted pyrenyl group.

2. The hardmask composition as claimed in claim 1, wherein A is a substituted or unsubstituted divalent group of Group 1:

[Group 1]

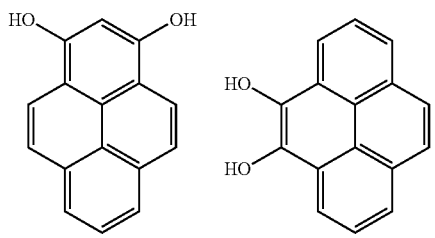

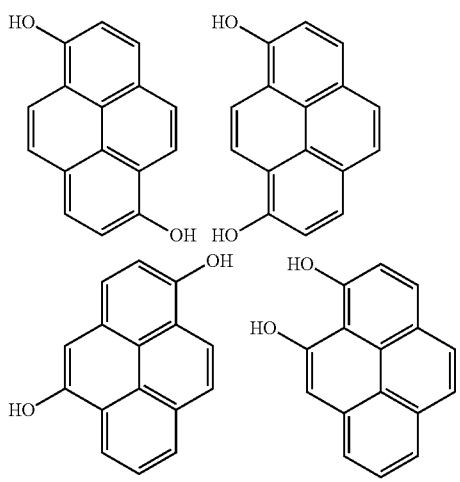

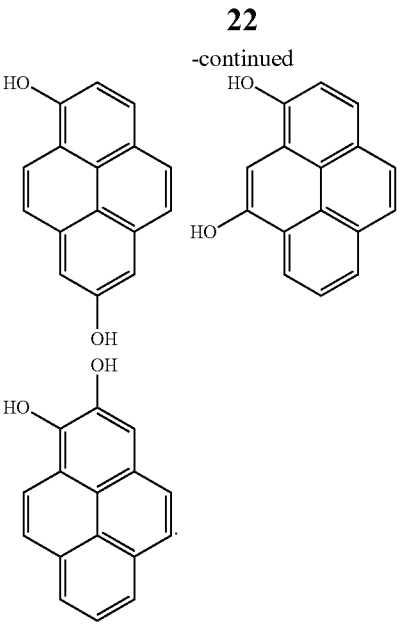

3. The hardmask composition as claimed in claim 1, wherein E is:

an unsubstituted pyrenyl group, or a pyrenyl group substituted with a substituent, the substituent being deuterium, a halogen, a nitro group, an amino group, a hydroxy group, a substituted or unsubstituted C1 to C30 alkoxy group, a substituted or unsubstituted C1 to C30 alkyl group, a substituted or unsubstituted C1 to C30 alkenyl group, a substituted or unsubstituted C1 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

4. The hardmask composition as claimed in claim 1, wherein E is a monovalent group of Group 2:

[Group 2]

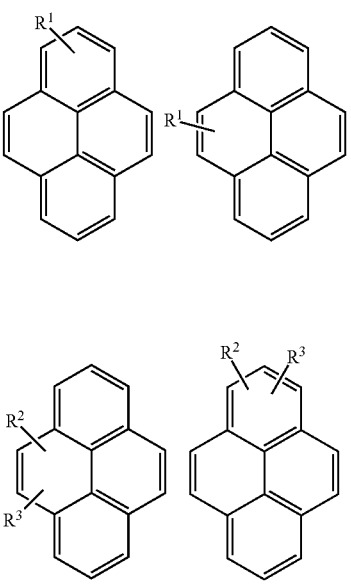

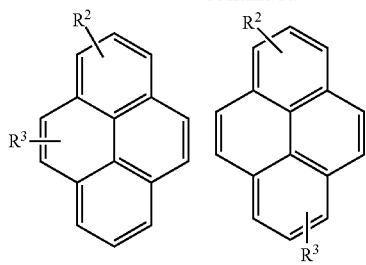

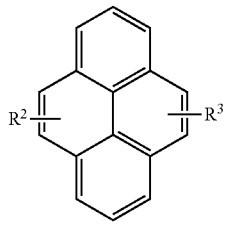

wherein, in Group 2, R¹ to R³ are independently hydrogen, deuterium, a halogen, a nitro group, an amino group, a hydroxy group, a substituted or unsubstituted C1 to C30 alkoxy group, a substituted or unsubstituted C1 to C30 alkyl group, a substituted or unsubstituted C1 to C30 alkenyl group, a substituted or unsubstituted C1 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

5. The hardmask composition as claimed in claim 1, wherein E is a 1-hydroxy pyrenyl group or a pyrenyl group.

6. The hardmask composition as claimed in claim 1, wherein the structural unit represented by Chemical Formula 1 is represented by Chemical Formula 2 or Chemical Formula 3:

[Chemical Formula 2]

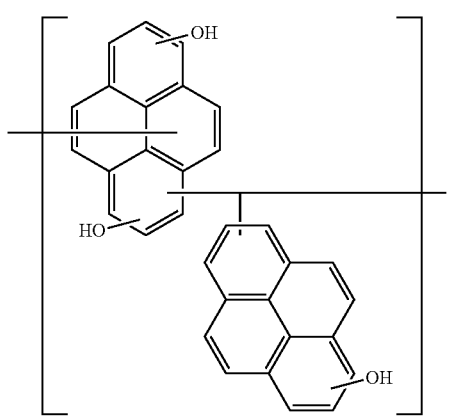

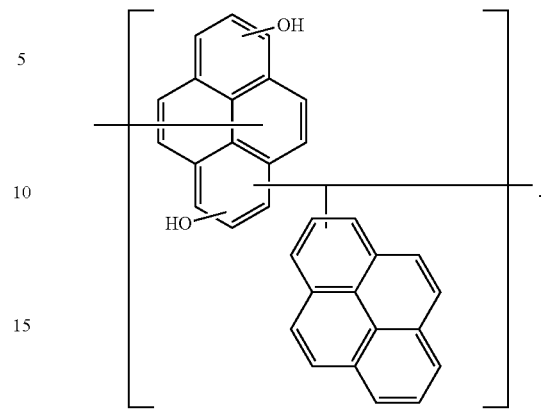

7. The hardmask composition as claimed in claim 1, wherein the structural unit is obtained by a reaction of:
a substituted or unsubstituted dihydroxy pyrene, and
a substituted or unsubstituted pyrene carboxaldehyde.

8. The hardmask composition as claimed in claim 7, wherein the substituted or unsubstituted dihydroxy pyrene is a substituted or unsubstituted compound of Group 1':

[Group 1']

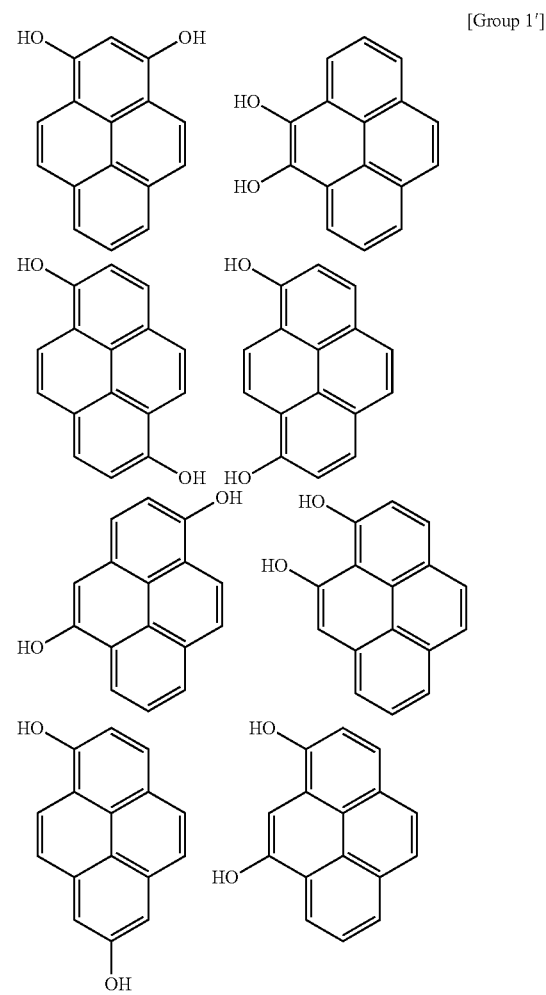

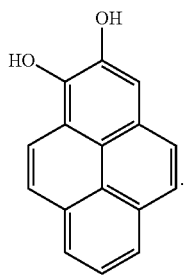

9. The hardmask composition as claimed in claim 7, wherein the substituted or unsubstituted pyrene carboxaldehyde comprises a moiety of Group 2':

[Group 2']

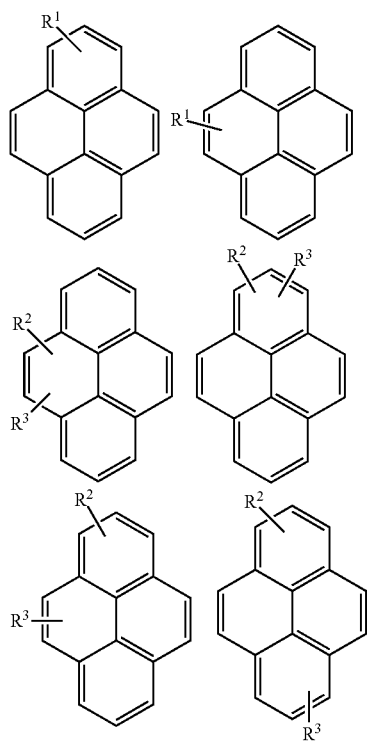

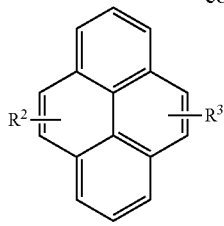

wherein, in Group 2', $R^1$ to $R^3$ are independently hydrogen, deuterium, a halogen, a nitro group, an amino group, a hydroxy group, a substituted or unsubstituted C1 to C30 alkoxy group, a substituted or unsubstituted C1 to C30 alkyl group, a substituted or unsubstituted C1 to C30 alkenyl group, a substituted or unsubstituted C1 to C30 alkynyl group, a substituted or unsubstituted C3 to C30 cycloalkyl group, a substituted or unsubstituted C6 to C30 aryl group, a substituted or unsubstituted C3 to C30 heterocyclic group, or a combination thereof.

10. A hardmask layer comprising a cured product of the hardmask composition as claimed in claim 1.

11. The hardmask layer as claimed in claim 10, wherein the cured product includes a condensed polycyclic aromatic hydrocarbon.

12. A method of forming patterns, the method comprising:
applying the hardmask composition as claimed in claim 1 on a material layer and heat-treating the resultant to form a hardmask layer,
forming a photoresist layer on the hardmask layer,
exposing and developing the photoresist layer to form a photoresist pattern,
selectively removing the hardmask layer using the photoresist pattern to expose a portion of the material layer, and
etching the exposed portion of the material layer.

* * * * *